(12) United States Patent
Sahu et al.

(10) Patent No.: US 11,206,051 B2
(45) Date of Patent: *Dec. 21, 2021

(54) DIGITAL OFFSET FREQUENCY GENERATOR BASED RADIO FREQUENCY TRANSMITTER

(71) Applicant: TEXAS INSTRUMENTS INCORPORATED, Dallas, TX (US)

(72) Inventors: Debapriya Sahu, Bangalore (IN); Srinivas Venkata Veeramreddi, Basava Nagar (IN); Raghu Ganesan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/896,557

(22) Filed: Jun. 9, 2020

(65) Prior Publication Data

US 2020/0304161 A1 Sep. 24, 2020

Related U.S. Application Data

(63) Continuation of application No. 15/858,246, filed on Dec. 29, 2017, now Pat. No. 10,715,194.

(51) Int. Cl.
*H04B 1/16* (2006.01)
*H03F 3/19* (2006.01)
(Continued)

(52) U.S. Cl.
CPC ............ *H04B 1/16* (2013.01); *H03F 3/19* (2013.01); *H03F 3/21* (2013.01); *H03L 7/06* (2013.01);
(Continued)

(58) Field of Classification Search
CPC ... H04B 1/16; H04B 1/04; H04B 1/40; H04B 1/10; H04B 2001/0491; H03F 3/19;
(Continued)

(56) References Cited

U.S. PATENT DOCUMENTS 10,715,194 B2 * 7/2020 Sahu .................. H03L 7/06
2005/0266805 A1 12/2005 Jensen
(Continued)

FOREIGN PATENT DOCUMENTS

CN 1643795 A 7/2005
CN 1791087 A 6/2006
(Continued)

OTHER PUBLICATIONS

Notification of First Office Action of PRC (China) Pat. Appln. No. 201811599375.9; received Jun. 18, 2021, 3pages.
(Continued)

*Primary Examiner* — Lee Nguyen
(74) *Attorney, Agent, or Firm* — Ebby Abraham; Charles A. Brill; Frank D. Cimino

(57) ABSTRACT

A device includes a frequency multiplier circuit to receive a base frequency signal, multiply the base frequency signal, and output the multiple of the base frequency signal, and includes an offset frequency generator, including at least one logic gate, to receive the multiple of the base frequency signal and output an offset frequency signal from the at least one logic gate combination. A mixing circuit receives the offset frequency signal and a digital data signal, converts the digital data signal into an analog representation of the digital data signal, and mixes the offset frequency signal and the analog representation of the digital data signal to produce a mixed signal. The device yet further includes a power
(Continued)

amplifier to amplify the mixed signal and output the amplified mixed signal as an output frequency signal of the device.

8 Claims, 4 Drawing Sheets

(51) Int. Cl.
    *H03F 3/21*     (2006.01)
    *H03L 7/06*     (2006.01)
    *H03K 19/21*     (2006.01)
    *H03L 7/099*     (2006.01)
    *H04B 1/04*     (2006.01)

(52) U.S. Cl.
    CPC ........ *H03F 2200/451* (2013.01); *H03K 19/21* (2013.01); *H03L 7/099* (2013.01); *H04B 1/04* (2013.01)

(58) Field of Classification Search
    CPC ...... H03F 3/21; H03F 2200/451; H03F 3/245; H03F 2200/294; H03F 2200/333; H03F 2200/387; H03F 2001/0491; H03F 1/26; H03F 1/56; H03F 1/223; H03F 3/265; H03K 19/21; H03K 21/08; H03L 7/099; H04L 27/0002
    USPC ........................................................ 455/118
    See application file for complete search history.

(56) References Cited

U.S. PATENT DOCUMENTS

| | | |
|---|---|---|
| 2014/0018014 A1 | 1/2014 | Modha et al. |
| 2018/0076837 A1 | 3/2018 | Torre et al. |

FOREIGN PATENT DOCUMENTS

| | | |
|---|---|---|
| CN | 1855747 A | 11/2006 |
| CN | 101281245 A | 10/2008 |
| CN | 102231628 A | 11/2011 |
| CN | 202261236 U | 5/2012 |
| CN | 103187971 A | 7/2013 |

OTHER PUBLICATIONS

First Office Action of PRC (China) Pat. Appln. No. 201811599375.9; received Jun. 18, 2021; 12 pages.
Translation of First Office Action of PRC (China) Pat. Appln. No. 201811599375.9; received Jun. 18, 2021, 12 pages.

\* cited by examiner

US 11,206,051 B2

DIGITAL OFFSET FREQUENCY GENERATOR BASED RADIO FREQUENCY TRANSMITTER

CROSS-REFERENCE TO RELATED APPLICATIONS

This application is a continuation application of U.S. patent application Ser. No. 15/858,246 filed on Dec. 29, 2017, the contents of which are herein incorporated by reference in its entirety.

TECHNICAL FIELD

This disclosure relates generally to a radio frequency transmitter, and more specifically to a frequency generator-based radio frequency transmitter.

BACKGROUND

Radio frequency (RF) transmitters are used in a variety of devices that rely on wireless communications. These RF transmitters operate at a variety of frequencies based on their application. For example, cellular telephones, WiFi devices, Bluetooth devices, digital radio, etc. all operate at a variety of frequencies. These RF transmitters typically integrate a high-power power amplifier (PA) for amplifying signals often with large amplitude modulation, for example with a large peak-to-average (PAR) ratio. Such RF transmitters typically employ a voltage controlled oscillator (VCO) for producing one or more radio frequencies as a basis for producing a desired output frequency. Such signals with large amplitude modulation cause frequency pulling of a voltage controlled oscillator (VCO) that produces one or more of these radio frequencies if the VCO frequency is tuned to the desired output frequency or its harmonic, for example a multiple of the desired output frequency. Typically offset-local oscillator (LO) schemes are employed to produce a VCO frequency that is not equal to the desired output frequency or its harmonic. For example, an active offset frequency mixer is typically utilized to convert an offset VCO frequency to the desired output frequency, e.g., a channel frequency. Such active mixers consume lot of current as they need to meet a phase noise target as well as provide a strong offset frequency signal. Such typical offset-LO schemes often require multiple inductor capacitor (LC)-tuned stages which demand large silicon area to attenuate non-channel components.

SUMMARY

One example relates to a device that includes a frequency multiplier circuit to receive a base frequency signal, multiply the base frequency signal, and output the multiple of the base frequency signal, and includes an offset frequency generator, including at least one logic gate, to receive the multiple of the base frequency signal and output an offset frequency signal from the at least one logic gate. The device further includes a mixing circuit to receive the offset frequency signal and a digital data signal, convert the digital data signal into an analog representation of the digital data signal, and mix the offset frequency signal and the analog representation of the digital data signal to produce a mixed signal. The device yet further includes a power amplifier to amplify the mixed signal and output the amplified mixed signal as an output frequency signal of the device.

Another example relates to a method that includes multiplying a base frequency signal, producing an offset frequency signal with at least one logic gate, and converting a digital data signal into an analog representation of the digital data signal. The method further includes mixing the offset frequency signal and the analog representation of the digital data signal to produce a mixed signal. The method yet further includes amplifying the mixed signal and outputting the amplified mixed signal as an output frequency signal.

Yet another example relates to another device that includes a frequency multiplier circuit to receive a base frequency signal, multiply the base frequency signal, and output the multiple of the base frequency signal, and includes an offset frequency generator, including at least one logic gate, to receive the multiple of the base frequency signal and output an offset frequency signal from the at least one logic gate. The device further includes a mixing circuit to receive the offset frequency signal and a digital data signal that includes an in-phase component and a quadrature component, convert the in-phase and quadrature components into first and second analog representations of the in-phase and quadrature components, mix the offset frequency signal and the analog representations of the in-phase and quadrature components to produce first and second mixed signal, combine the first and second mixed signal to produce a combined signal. The device yet further includes a power amplifier to amplify the combined signal and output the amplified combined signal as an output frequency signal of the device.

DETAILED DESCRIPTION

The disclosure relates to a device that includes a frequency multiplier circuit to receive a base frequency signal, multiply the base frequency signal, and output the multiple of the base frequency signal, and an offset frequency generator, including at least one logic gate, to receive the multiple of the base frequency signal and output an offset frequency signal from the at least one logic gate. The device further includes a mixing circuit to receive the offset frequency signal and a digital data signal, convert the digital data signal into an analog representation of the digital data signal, mix the offset frequency signal and the analog representation of the digital data signal to produce a mixed signal, the mixed signal being a different frequency and a non-harmonic of the multiple of the base frequency signal. The device yet further includes a power amplifier to amplify the mixed signal and output the amplified mixed signal as an output frequency signal of the device.

An application for such a device is a radio frequency (RF) transmitter, with the device being utilized in cellular telephones, WiFi devices, Bluetooth devices, digital radio, or any other device that utilizes an RF transmitter. As compared to a typical RF transmitter that utilizes an offset frequency mixer, buffer(s), and filter(s) to produce an offset frequency signal, the logic gate based offset frequency generator is less complex which results in consumption of less power, taking up less silicon area to implement, and achieves a better noise figure (NF). Moreover, the device does not require combiner(s) that are utilized by some typical frequency mixer circuits, which further reduces power consumption of the device and silicon area to implement.

Figure 1:
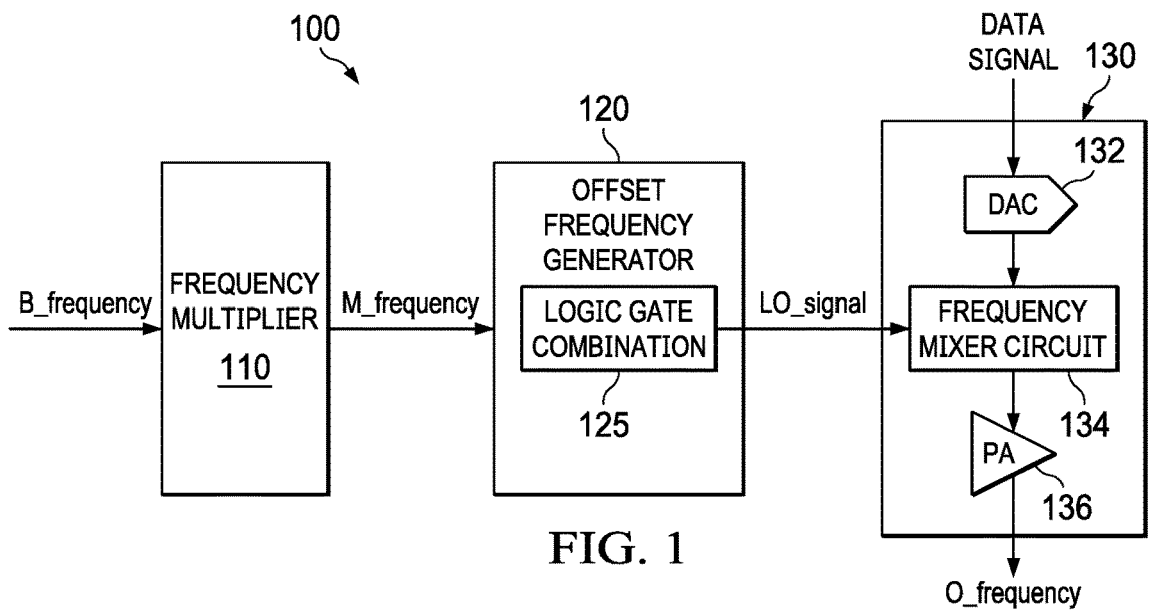
FIG. 1 illustrates an example device that includes a logic gate based local offset frequency generator.

FIG. 1 illustrates an example device 100 (e.g., a radio frequency transmitter) that includes at least one logic gate 125 based offset frequency generator 120, the offset frequency generator 120 generating an offset frequency locally on the device 100 using a local oscillator. The example device 100 includes a frequency multiplier 110 that is coupled to the offset frequency generator 120. The frequency multiplier 110 accepts as an input a base frequency signal B_frequency. The frequency multiplier 110 multiplies this base frequency signal B_frequency by a multiple to produce a multiple of the base frequency signal M_frequency. Thus, the multiple of the base frequency signal M_frequency is a product of a multiplier factor X, with X multiplied by the base frequency signal B_frequency to produce the multiple of the base frequency signal M_frequency. The frequency multiplier 110 outputs the multiple of the base frequency signal M_frequency.

The offset frequency generator 120 is further coupled to a mixing circuit 130. The offset frequency generator 120 includes at least one logic gate 125. The offset frequency generator 120 accepts as an input the multiple of the base frequency M_frequency. The offset frequency generator 120 outputs an offset frequency signal LO_signal from the logic gate 125. The offset frequency generator 120 outputs the offset frequency signal to the mixing circuit 130. By being based on the logic gate 125, the offset frequency generator 120 achieves a better phase noise (NF), can be implemented in less silicon area, and has smaller power consumption as compared to a typical local offset frequency generator.

The mixing circuit 130 receives the offset frequency signal and a digital data signal. The mixing circuit 130 includes a digital-to-analog converter (DAC) 132 that receives the digital data signal as an input and outputs an analog representation of this digital signal. The mixing circuit 130 further includes a frequency mixer circuit 134, with the DAC 132 being coupled to this frequency mixer circuit 134. The frequency mixer circuit 134 receives the analog representation of the digital signal and the offset frequency signal from the logic gate 125 as inputs and mixes the two signals to produce a mixed signal. This mixed signal is a different frequency and a non-harmonic of the multiple of the base frequency signal produced by the frequency multiplier 110. The mixing circuit 130 further includes a power amplifier (PA) 136 coupled to the frequency mixing circuit 134. The PA 136 amplifies the mixed signal and outputs the amplified mixed signal as an output frequency signal O_frequency of the device 100.

Figure 2:
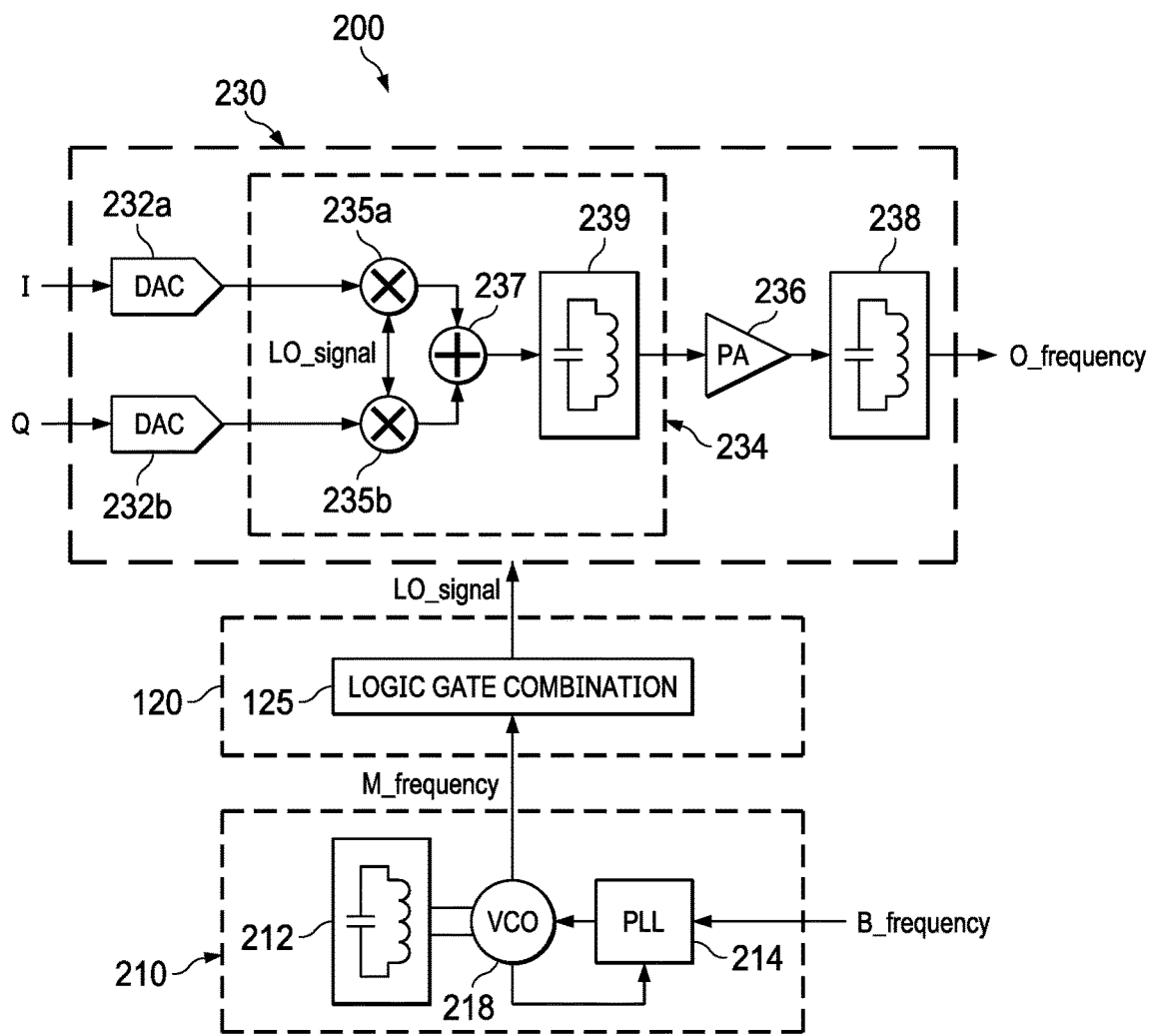
FIG. 2 illustrates another example device that includes a logic gate based offset frequency generator.

FIG. 2 illustrates another example device 200 that includes a logic gate based offset frequency generator. The device 200 (e.g., a radio frequency transmitter) includes at least some of the features and components from device 100. The device 200 includes a frequency multiplier 210 that includes a phase-locked loop (PLL) 214 that receives as an input a base frequency signal B_frequency and stabilizes the frequency of base frequency signal B_frequency. The PLL 214 is coupled to a voltage controlled oscillator (VCO) 218 whose output frequency is phase locked to the B-frequency by the PLL 214, the VCO 218 generating an intermediate multiple of the base frequency signal. The VCO 218 is coupled to an LC filter 212 which is an LC resonator of VCO 218. The PLL 214 forms a forward path of a PLL circuit, with the output of the VCO 218 being provided as a feedback input to the forward path of the PLL 214 to form the PLL circuit. In an example, the base frequency signal is 40 MHz and the intermediate multiple of the base frequency signal M_frequency is 6.4 GHz.

In this example, the circuit further includes a mixing circuit 230 and the digital data signal includes in-phase and quadrature components. The mixing circuit 230 includes two DACs 232a, 232b. The first DAC 232a receives the in-phase component as an input and the second DAC 232b receives as an input the quadrature component. In an example, the in-phase and quadrature components of the digital data signal are DC to 10 MHz signals that are ninety degrees out of phase with each other. The first and second DACs 232a, 232b generate an analog representation of the in-phase and quadrature components of the digital data signal, respectively. The frequency mixer circuit 234 receives the analog representation of the in-phase and quadrature components of the digital data signal as an input, the frequency mixer circuit 234 coupled to the first and second DACs 232a, 232b.

The frequency mixer circuit 234 includes first and second frequency mixers 235a, 235b. The first and second DACs 232a, 232b are coupled to the first and second frequency mixers 235a, 235b, respectively, the first and second frequency mixers 235a, 235b creating new frequencies from two signals applied to it. For example, the first and second frequency mixers 235a, 235b produce new signals at a sum and difference of the original frequencies. The first and second frequency mixers 235a, 235b receive both the analog representation of the in-phase and quadrature components of the digital data signal produced by the first and second DACs 232a, 232b, respectively, and the in-phase and quadrature offset frequency signal LO_signal from the logic gate 125. In an example, the offset frequency generator 120 receives a 6.4 GHz signal as an input and generates a 2.4 GHz signal to both the first and second frequency mixers 235a, 235b. In this example, the frequency mixer circuit 234 further includes a combiner 237, with the first and second frequency mixers 235a, 235b being coupled to the combiner 237. The combiner 237 then combines the signals generated by the first and second frequency mixers 235a, 235b to produce a combined signal. The combiner 237 generates this combined signal to a filter 239 (e.g., L/C filter) that suppresses noise components within this combined signal, i.e., a noise suppressed mixed signal. In some typical circuits, an additional frequency mixer is utilized to produce the mixed signal. The configuration illustrated in FIG. 2 does not require this additional frequency mixer, reducing complexity, silicon size, losses, and likewise power requirements of the device 200.

The mixing circuit 230 further includes a PA 236 that is coupled to the filter 239. The PA 236 receives the noise suppressed combined signal from the filter 239. The PA 236 amplifies this signal and generates an amplified version of this signal. Before this signal is generated from the device 200, another filter 238 (e.g., L/C filter) receives the amplified version of this signal as an input and suppresses noise components within the amplified version of this signal. The filter 238 generates the filtered amplified version of this signal as an output frequency signal O_frequency of the device 200. In an example, the output frequency signal O_frequency is 2.4 GHz.

Figure 3A:
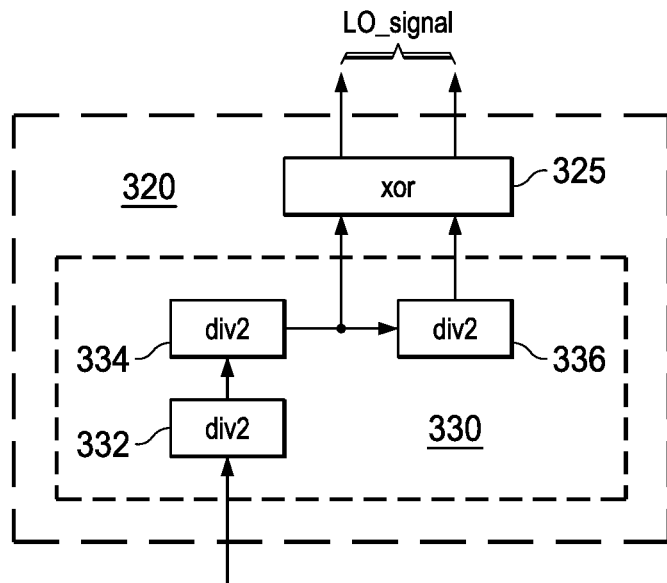
FIGS. 3A and 3B illustrate examples of offset local oscillation generators.

FIG. 3A illustrates an example offset frequency generator 320. The offset frequency generator 320 includes a pseudo-differential digital divider 330 that includes first, second, and third dividers 332, 334, 336. The first divider 332 receives the multiple of the base frequency signal M_frequency as an input and divides it by two. In an example, the multiple of the base frequency signal M_frequency is 6.4 GHz and the first divider 332 generates a first intermediate frequency signal of 3.2 GHz. The pseudo-differential digital divider 330 further includes a second divider 334 that is coupled to the first divider 332 and divides the first intermediate signal by two. Thus, the second divider 334 generates a second intermediate frequency signal. In an example, the second divider 334 receives the first intermediate frequency signal of 3.2 GHz as an input and generates a second intermediate frequency signal of 1.6 GHz. The second divider 334 is further coupled to the third divider 336. The third divider 336 divides the second intermediate frequency signal from the second divider 334 by two and generates a third intermediate frequency signal. In an example, the third intermediate frequency signal is 0.8 GHz. In an example, both in-phase and quadrature components of 0.8 GHz are available from the third diver 336.

In this example, the offset frequency generator 320 includes an exclusive OR (XOR) gate 325. The XOR gate 325 is coupled to both the second and third dividers 334, 336 and exclusively ORs the signals produced by the second and third dividers 334, 336 (e.g., applies an XOR function to the outputs). In an example, the XOR gate 325 exclusively ORs the second and third intermediate frequency signals of 1.6 GHz and 0.8 GHz to produce the offset frequency signal LO_signal of 2.4 GHz.

Figure 3B:
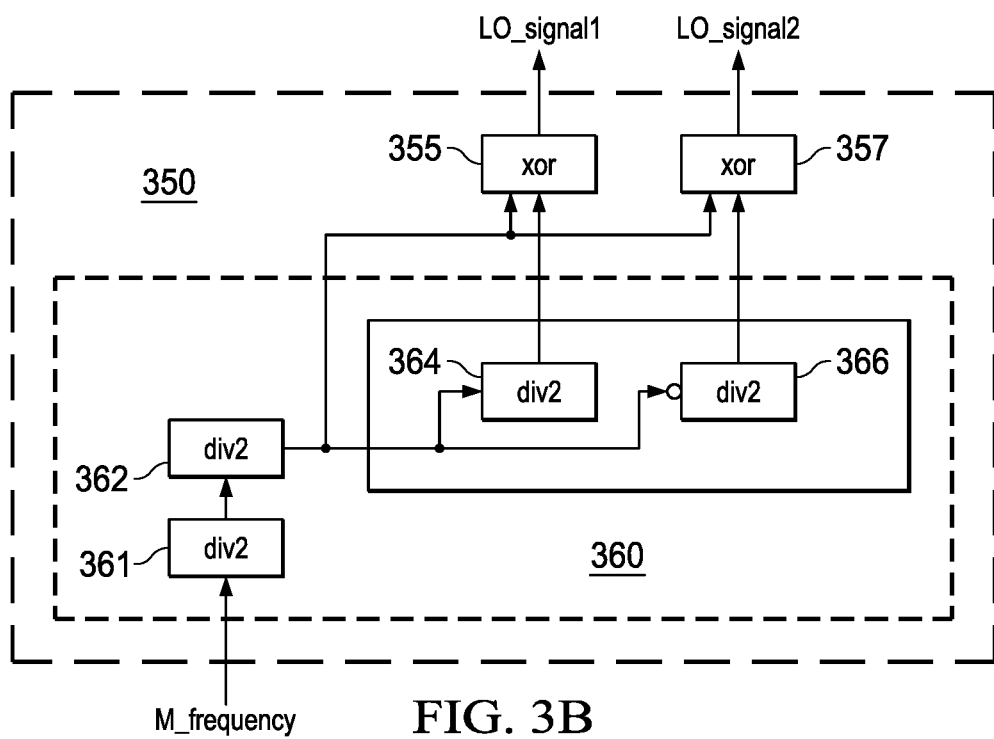

FIG. 3B illustrates another example offset frequency generator 350. The offset frequency generator 350 includes a pseudo-differential digital divider 360 that includes first, second, and two sections of a third divider 361, 362, 364, 366. The first divider 361 receives the multiple of the base frequency signal M_frequency as an input and divides it by two. In an example, the multiple of the base frequency signal M_frequency is 6.4 GHz and the first divider 361 generates a first intermediate frequency signal of 3.2 GHz. The second divider 362 receives the generated frequency of 361 as an input and divides it by two. In an example, the second divider 362 receives the first intermediate frequency 3.2 GHz and the second divider 362 generates a second intermediate frequency signal of 1.6 GHz. The pseudo-differential digital divider 360 further includes a third divider consisting of two stages 364 and 366 that is coupled to the second divider 362 and divides the second intermediate signal by two. Thus, the third divider 364, 366 generates a third intermediate frequency signal. In an example, the third divider 364, 366 receives the second intermediate frequency signal of 1.6 GHz as an input and generates a quadrature component of the third intermediate frequency signal of 0.8 GHz. Divider stages 364 and 366 generate two phases (in phase and quadrature) of the third intermediate frequency, respectively. The in-phase and quadrature phases are offset in phase by one-quarter cycle (π/2 radians). Although the intermediate frequency signals produced by the dividers 334, 336, 364, 366 may be a harmonic of the base frequency signal B_frequency, they do not create problems within the device 100, 200, 300 because enough off-chip and on-chip attenuation is provided by the offset frequency generator 120, 320, 350.

In this example, the offset frequency generator 350 includes two exclusive OR (XOR) gates 355, 357. The XOR gate 355 is coupled to the second divider and first stage of third divider 362, 364 and exclusively ORs the signals produced by the second and third dividers 362, 364. The XOR gate 357 is coupled to the second divider and the second stage of third divider 362, 366 and exclusively ORs the signals produced by the second and third dividers 362, 366. In an example, the XOR gate 355 exclusively ORs intermediate frequency signals of 1.6 GHz and 0.8 GHz to produce a first offset frequency signal LO_signal1 of 2.4 GHz and the XOR gate 357 exclusively ORs intermediate frequency signals of 1.6 GHz and 0.8 GHz to produce a second offset frequency signal LO_signal2 of 2.4 GHz. For example, the first XOR gate 355 exclusively ORs 1.6 GHz with in-phase component of 0.8 GHz to generate the in-phase LO component and the second XOR gate 357 exclusively ORs the 1.6 GHz with quadrature component of 0.8 GHz to generate the quadrature LO component. In an example, both in-phase and quadrature components of 0.8 GHz are available from the two sections of third divider 364, 366. In an example, the first and second offset frequency signals LO_signal1, LO_signal2 are in-phase and quadrature components of the digital data signal. The combination of the pseudo-differential digital dividers 330, 360 and the XOR gates 325, 355, 357 allow the devices 100, 200 to avoid use of a typical active offset-mixer, which reduces current consumption and silicon area in comparison to use of the typical active offset-mixer.

Figure 4A:
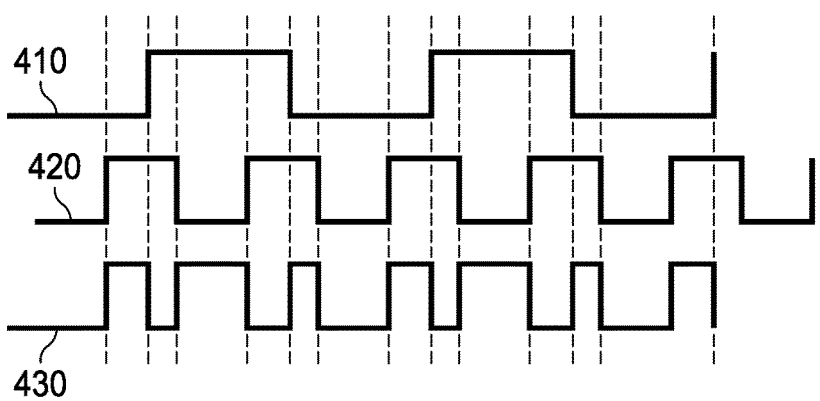
FIGS. 4A and 4B illustrate timing diagrams of signals of the offset local oscillation generators illustrated in FIGS. 3A and 3B, respectively.

FIG. 4A illustrates a timing diagram of signals of the offset frequency generator 320 illustrated in FIG. 3A. Signal 410 represents the third intermediate frequency signal of 0.8 GHz produced by the third divider 336. Signal 420 represents the second intermediate frequency signal of 1.6 GHz produced by the second divider 334. Signal 430 represents the offset frequency signal LO_signal of 2.4 GHz produced by the XOR gate 325 exclusively ORing signals 410 and 420. As illustrated, the signal 430 is made up of square waves of uneven varying widths which result from exclusively ORing signals 410, 420 of two different frequencies. Although signal 430 includes such uneven varying width square waves, the ultimate frequency of this signal is maintained at the offset frequency signal LO_signal of 2.4 GHz. The varying width or duty cycle is present because of a presence of LO_signal components, e.g., at 0.8 GHz and 4 GHz, which are generated by mixing performed by the XOR gate 325. Mixing caused by these components at the output of combiner 237 is filtered by LC filters 239 and 238.

Figure 4B:
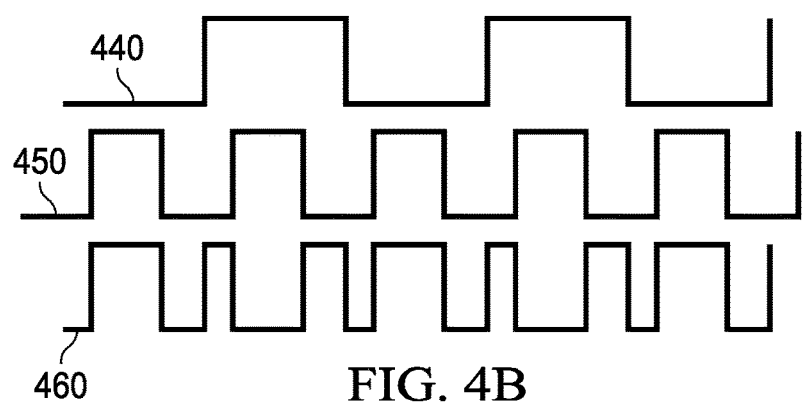

FIGS. 4A and 4B illustrate the timing diagram of signals of the offset frequency generator 350 illustrated in FIG. 3B. Signals 410 and 440 represent the intermediate frequency signal of 0.8 GHz produced by the third divider sections 364 and 366. Signals 450 and 420 represent the intermediate frequency signal of 1.6 GHz produced by the first divider 362. Signals 430 and 460 represent the offset frequency signals LO_signal1, LO_signal2 of 2.4 GHz produced by the XOR gates 355, 357 exclusively ORing signals 410 with 420, and 440 with 450. Signals 420 and 450 are a same signal. As illustrated, the signals 430 and 460 are made up of square waves of uneven varying widths which result from exclusively ORing signals 410, 420 and 440, 450 of two different frequencies. Although signals 430 and 460 include such uneven varying width square waves, the ultimate frequency of this signal is maintained at the offset frequency signals LO_signal1, LO_signal2 of 2.4 GHz. The varying width or duty cycle is present because of the presence of other mixing components of the second and third intermediate frequencies, e.g., at 0.8 GHz and 4 GHz, which are generated by mixing performed by the XOR gates 355, 357. Mixing caused by these components at the output of combiner 237 is filtered by LC filters 239 and 238.

Figure 5:
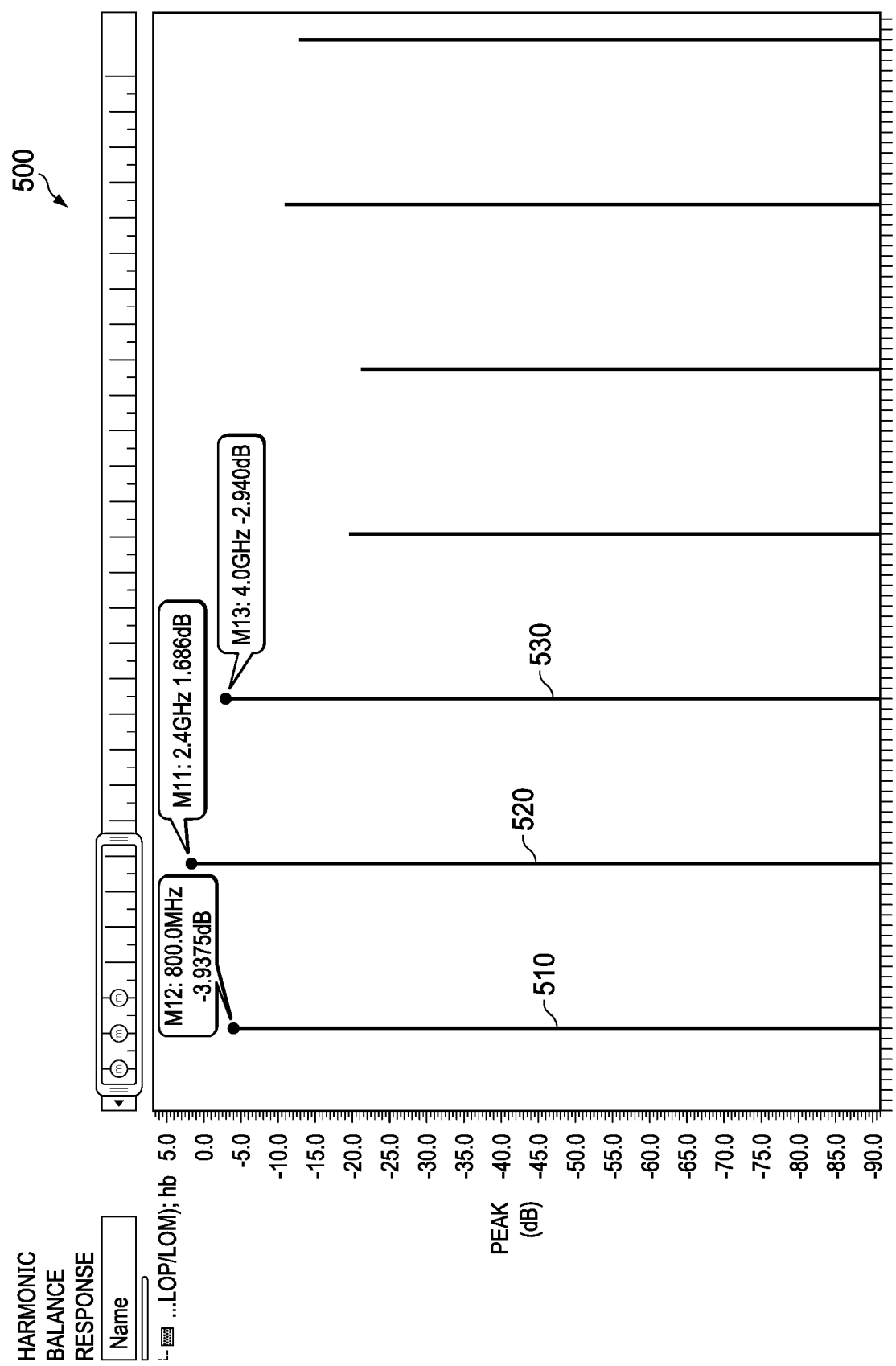
FIG. 5 illustrates a synthesized clock spectrum graph of the offset frequency signal LO_signal shown in FIGS. 1-4.

FIG. 5 illustrates a synthesized clock spectrum graph of the offset frequency signal LO_signal shown in FIGS. 1-4. In particular, a 2.4 GHz offset frequency signal LO_signal is shown at 520, at 1.686 dB. Along with a desired local oscillator signal LO_signal two side tone frequencies are also produced, shown at 510 and 530. In particular, an 800 MHz side band frequency at −3.9375 dB is shown at 510 and a 4.0 GHz side band frequency at −2.9406 dB is shown at 530. These side bands are later filtered out with filter(s) within the mixing circuits 130, 230.

Figure 6:
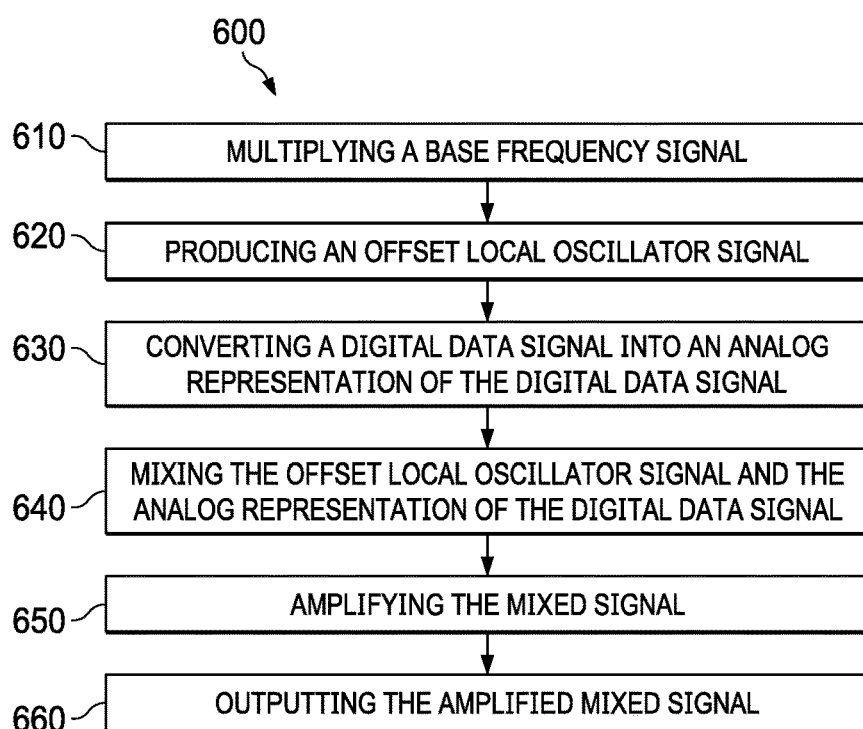
FIG. 6 illustrates an example method of producing an output frequency signal O_frequency from a base frequency signal B_frequency.

In view of the foregoing structural and functional features described above, a method in accordance with various aspects of the present disclosure will be better appreciated with reference to FIG. 6. While, for purposes of simplicity of explanation, the method of FIG. 6 is shown and described as executing serially, it is to be understood and appreciated that the present disclosure is not limited by the illustrated order, as some aspects may, in accordance with the present disclosure, occur in different orders and/or concurrently with other aspects from that shown and described herein. Moreover, not all illustrated features may be required to implement a method in accordance with an aspect of the present disclosure. The example method of FIG. 6 may be implemented by hardware, such as in an IC chip or a combination of analog and/or discrete circuit components. In the example of FIG. 6, for purposes of explanation, the method 600 is described in the context of the example devices of FIGS. 1-3. In other examples, the method 600 may be implemented with respect to circuits and devices configured differently.

FIG. 6 illustrates an example method 600 of producing the output frequency signal O_frequency from the base frequency signal B_frequency. At 610, the method 600 includes multiplying a base frequency signal. In an example, the frequency multiplier 110, 210 multiplies the base frequency signal B_frequency to produce the multiple of the base frequency M_frequency. This multiple of the base frequency M_frequency is generated from the frequency multiplier 110, 210.

At 620, the method 600 further includes producing an offset frequency signal LO_signal with a logic gate, e.g., logic gate 125, XOR gate 325. For example, the offset frequency generator 120, 320 includes logic gate 125, XOR gate 325 that produces the offset frequency signal LO_signal. In an example, the XOR gate 325 receives two signals of different frequencies, second and third intermediate frequencies from second and third dividers 334, 336, respectively, and exclusively ORs them to produce the offset frequency signal LO_signal.

At 630, the method 600 yet further includes converting a digital data signal into an analog representation of the digital data signal. In an example, the DAC 132 receives the digital data signal. In another example, the DACs 232a, 232b receive in-phase and quadrature components of the digital data signal. The DACs 132, 232a, 232b convert these digital data signals into an analog representation of these digital data signals.

At 640, the method 600 includes mixing the offset frequency signal LO_signal and the analog representation of the digital data signal to produce a mixed signal, the mixed signal being a different frequency and a non-harmonic of the multiple of the base frequency signal M_frequency produced by frequency multiplier 110, 210. In an example, the frequency mixer circuit 134 combines the offset frequency signal LO_signal and the analog representation of the digital data signal to produce a mixed signal. In another example, the first and second frequency mixers 235a, 235b receive both the analog representation of the in-phase and quadrature components of the digital data signal produced by the first and second DACs 232a, 232b, respectively, and the offset frequency signal LO_signal from the logic gate 125. The combiner 237 then combines the outputs of the first and second frequency mixers 235a, 235b to produce the mixed signal. In an example, the mixed signal is a different frequency and a non-harmonic of the multiple of the base frequency signal. In an example, the combiner 237 outputs this mixed signal to the filter 239 that suppresses noise components within this mixed signal and outputs the noise suppressed mixed signal.

At 650, the method 600 even further includes amplifying the mixed signal. In an example, the PA 136 amplifies the mixed signal to produce the output frequency signal O_frequency. In another example, the PA 236 amplifies the mixed signal to produce the amplified version of this signal. The filter 238 filters out noise components within the amplified version of this signal and outputs the output frequency signal O_frequency of the device 200. At 660, the method 600 outputs the amplified mixed signal as the output frequency signal O_frequency of the device 100, 200.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A device, comprising:
   a frequency multiplier circuit having a base frequency signal input and a base frequency signal output;
   a first divider circuit having an input and an output, the first divider circuit input is coupled to the base frequency signal output;
   a second divider circuit having an input and an output, the second divider circuit output is coupled to the first divider circuit output;
   an XOR gate having a first input, a second input, and an output, the XOR gate first input is coupled to the first divider circuit output, and the XOR gate second input is coupled to the second divider circuit output;
   a mixer with an input, an analog data signal input, and an output, the mixer input is coupled to the XOR gate output; and
   a power amplifier having an input and an output, the power amplifier input is coupled to the mixer output.

2. The device of claim 1, further comprising a digital-to-analog converter having a digital data signal input configured to receive a data signal and an output coupled to the mixer's analog data signal input, wherein the data signal includes an in-phase component and a quadrature component.

3. The device of claim 1, further comprising first and second digital-to-analog converters, the first digital-to-analog converter to receive the in-phase component and output an analog representation of the in-phase component to the mixer's analog data signal input and the second digital-to-analog converter to receive the quadrature component and output an analog representation of the quadrature component to the mixer's analog data signal input.

4. The device of claim 1, wherein the mixer is coupled to an inductor capacitor filter.

5. A method, comprising:
- multiplying a base frequency signal;
- dividing the base frequency signal to produce a first intermediate frequency signal;
- dividing the first intermediate frequency signal to produce a second intermediate frequency signal;
- dividing the second intermediate frequency signal to produce a third intermediate frequency signal; and
- gating the second and third intermediate frequency signals with an exclusive OR gate to produce an offset frequency signal;
- converting a digital data signal into an analog representation of the digital data signal;
- mixing the offset frequency signal and the analog representation of the digital data signal to produce a mixed signal;
- amplifying the mixed signal; and
- outputting the amplified mixed signal as an output frequency signal.

6. The method of claim 5, wherein the digital data signal includes an in-phase component and a quadrature component.

7. The method of claim 6, wherein the converting the digital data signal includes converting the in-phase component to produce a first analog representation of the in-phase component and converting the quadrature component to produce an analog representation of the quadrature component.

8. The method of claim 5, further comprising filtering the amplified mixed signal.

* * * * *